US009210799B2

(12) United States Patent
Gough et al.

(10) Patent No.: US 9,210,799 B2
(45) Date of Patent: Dec. 8, 2015

(54) APPARATUS AND METHOD FOR REPRODUCING AN AUDIO SIGNAL (75) Inventors: David Gough, Cypress, TX (US); Arthur L. Daniel, Tomball, TX (US); Kevin L. Massaro, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1111 days.

(21) Appl. No.: 13/259,393

(22) PCT Filed: Sep. 17, 2009

(86) PCT No.: PCT/US2009/057341
§ 371 (c)(1),
(2), (4) Date: Sep. 23, 2011

(87) PCT Pub. No.: WO2011/034534
PCT Pub. Date: Mar. 24, 2011

(65) Prior Publication Data
US 2012/0016504 A1 Jan. 19, 2012

(51) Int. Cl.
*G06F 17/00* (2006.01)
*H05K 1/02* (2006.01)

(52) U.S. Cl.
CPC ............ *H05K 1/0227* (2013.01); *H05K 1/0219* (2013.01); *H05K 1/0259* (2013.01); *H05K 2201/09618* (2013.01); *H05K 2201/09663* (2013.01); *H05K 2201/09972* (2013.01)

(58) Field of Classification Search
CPC .............. H05K 1/0219; H05K 1/0227; H05K 2201/09663; H05K 2201/09972
USPC .......................................................... 700/94
See application file for complete search history.

(56) References Cited

U.S. PATENT DOCUMENTS

| 5,231,308 | A | | 7/1993 | Fisch | |
|---|---|---|---|---|---|
| 5,475,606 | A | * | 12/1995 | Muyshondt et al. | ........... 174/257 |
| 5,587,920 | A | * | 12/1996 | Muyshondt et al. | ........... 716/137 |
| 6,133,805 | A | | 10/2000 | Jain et al. | |
| 6,804,504 | B1 | * | 10/2004 | Johnson et al. | ............... 455/344 |

(Continued)

FOREIGN PATENT DOCUMENTS

| CN | 101047396 | 10/2007 |
|---|---|---|
| CN | 101048032 | 10/2007 |

(Continued)

OTHER PUBLICATIONS

Ground wiring/lifting article establishing range of practices common to the average skill.*

(Continued)

*Primary Examiner* — Paul McCord
(74) *Attorney, Agent, or Firm* — Int'l IP Law Group (57) ABSTRACT There is provided an electronic device having an audio system for reproducing audio signals. An exemplary electronic device has an analog region and a separate and non-overlapping digital region. The electronic device comprises an analog ground plane disposed within the analog region and a digital ground plane disposed within the digital region. Digital circuitry is disposed opposite the digital ground plane, wherein digital signals are routed on or over the digital ground plane. Analog circuitry is disposed opposite the analog ground plane, wherein analog signals are routed on or over the analog ground plane. At least one audio output channel disposed opposite the analog ground plane.

18 Claims, 6 Drawing Sheets (56) References Cited

U.S. PATENT DOCUMENTS

| | | | | |
|---|---|---|---|---|
| 8,612,034 | B2* | 12/2013 | Wang | 700/94 |
| 2004/0144241 | A1* | 7/2004 | Juskiewicz et al. | 84/723 |
| 2005/0231124 | A1 | 10/2005 | Choi et al. | |
| 2007/0235832 | A1 | 10/2007 | Wang | |
| 2008/0099887 | A1* | 5/2008 | Song et al. | 257/663 |
| 2009/0080135 | A1* | 3/2009 | Major | 361/220 |

FOREIGN PATENT DOCUMENTS

| | | |
|---|---|---|
| CN | 200990726 | 12/2007 |
| CN | 201008172 | 1/2008 |
| EP | 0 614 331 B1 | 12/1996 |
| EP | 2254196 | 11/2010 |
| TW | 200629136 A | 8/2006 |
| TW | 200931817 A | 7/2009 |
| WO | WO-03086033 | 10/2003 |

OTHER PUBLICATIONS

Harris: How to Achieve Optimum Performance from Delta-Sigma A/D and D/A Converters, copyright 1993.*

German Office Action dated Apr. 14, 2014; issued in Appl. No. 112009005142.1; 4 pages.

International Searching Authority: International Search Report and Written Opinion, Appln No. PCT/US2009/057341, date of mailing May 20, 2010, 14 p.

Examination Report Under Section 18(3) received in GB Application No. 1206575.1, mailed Jul. 23. 2013, 4 pgs.

EPO; "Further Search Report under Section 17"; dated Apr. 28, 2014; 2 pages.

Examination Report Under Section 18(3) received in GB Application No. 1206575.1, mailed on Dec. 13, 2014, 3 pgs.

* cited by examiner

APPARATUS AND METHOD FOR REPRODUCING AN AUDIO SIGNAL

BACKGROUND

Many contemporary electronic devices are designed to reproduce music and/or other audio signals. These electronic devices, such as, for example, laptops, portable audio players, cell phones, or the like, typically provide for the connection of various audio-related peripheral components. Examples of these peripheral components include headphones and microphones. The electronic device may include several connectors or jacks intended to receive and electrically interconnect with a plug of an audio-related peripheral component to thereby transfer audio signals between the portable electronic device and the audio-related peripheral. The jacks and plugs are typically electrically connected to a ground reference to minimize damage to the electronic device from electrostatic discharge (ESD).

While such a ground configuration may create robust ESD performance, it can also result in a ground loop condition that introduces undesirable signals when audio signals are played. Examples of undesirable signals include electrical noise present on a power source signal, noise created by digital circuitry, or noise induced within the system by other sources of electrical interference.

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

Figure 1:
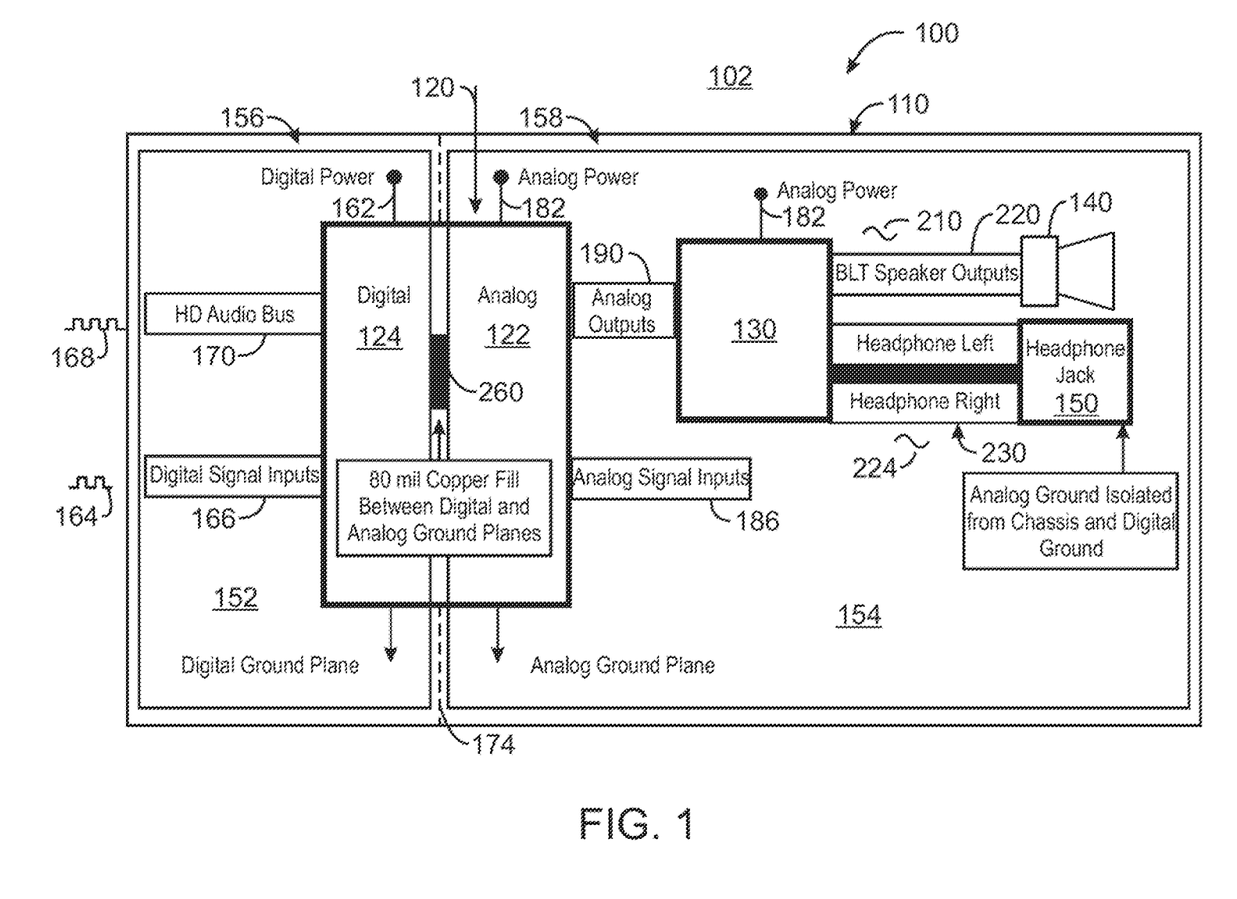
FIG. 1 is a block diagram of one embodiment of an electronic device having an audio system with an improved audio grounding configuration in accordance with an exemplary embodiment of the present invention.

Referring now to the drawings and particularly to FIG. 1, there is shown a block diagram of an audio system 100 having an improved grounding configuration in accordance with an exemplary embodiment of the present invention. The audio system 100 is one system of an electronic device 102, which may be any electronic device used at least in part to reproduce audio signals for presentation or listening by a user, such as, for example, a computer, laptop computer, cell phone, portable digital audio player or the like.

Those of ordinary skill in the art will appreciate that the functional blocks and devices shown in the figures are only one example of functional blocks and devices that may be implemented in an exemplary embodiment of the present invention. Moreover, other specific implementations containing different functional blocks may be chosen based on system design considerations.

The audio system 100 includes a printed circuit board (PCB) 110, such as, for example, a multi-layer printed circuit board, generally having various signal lines or traces transferring signals, including power, digital and audio signals, between the various functional components or blocks of audio system 100, as is more particularly described hereinafter. The audio system 100 further includes an audio control circuitry 120, such as, for example, an application specific integrated circuit, having an analog portion or circuitry 122 and a digital portion or circuitry 124. The analog portion or circuitry 122 of the audio control circuitry 120 is physically separate from the digital portion or circuitry 124 of the audio control circuitry 120. The audio system 100 further includes analog amplifier circuitry 130, a first audio output connector or jack 140 and a second audio output connector or jack 150.

The PCB 110 includes a digital ground plane (DGP) 152 and an analog ground plane (AGP) 154, each being formed from, for example, a layer of copper or other conductive material disposed on, over, or within PCB 110. The DGP 152 is disposed entirely within a first or digital region 156 of PCB 110. Similarly, the AGP 154 is disposed entirely within a second or analog region 158 of PCB 110. The first region 156 and the second region 158, respectively, of the PCB 110 are separate non-overlapping mutually-exclusive respective regions of the PCB 110. Similarly, the DGP 152 and the AGP 154 are separate non-overlapping and mutually-exclusive with respective to each other.

As shown in FIG. 1, the PCB 110 is configured as a single PCB. However, as one of ordinary skill in the art will appreciate, PCB 110 can be alternately configured, such as, for example, a first PCB for the analog region 158 and a second PCB for the digital region 156.

Generally, digital signals and digital components of audio system 100 are disposed on or over (i.e., opposite), and have as a common ground reference, DGP 152. More particularly, digital power is provided via a digital power line 162 to the digital circuitry 124 of the audio control circuitry 120, digital input signals 164 are provided to the digital circuitry 124 of the audio control circuitry 120 via digital inputs 166, and digital audio output signals 168 are output via digital audio bus 170 from the digital circuitry 124 of the audio control circuitry 120. Each of the digital power line 162, the digital input signals 164, the digital inputs 166, the digital audio output signals 168, the digital audio bus 170 and the digital circuitry 124 of the audio circuitry controller 120 are disposed over and have the DGP 152 as a common electrical ground reference. Thus, only digital signals and components, and no analog signals or components, are disposed or routed on or over the DGP 152.

Similarly, analog signals and analog components of audio system 100 are disposed on or over (i.e., opposite) and have as a common ground reference, AGP 154. Analog power is provided via an analog power line 182 to the analog circuitry 122 of the audio control circuitry 120 and to the audio amplifier circuitry 130. One or more analog signal inputs 186 provide analog input signals to the analog circuitry 122 of the audio control circuitry 120 via analog signal inputs 186, and analog output signals are provided via analog outputs 190 from the analog circuitry 122 of audio control circuitry 120 to the audio amplifier circuitry 130.

The audio amplifier circuitry 130, in turn, provides first audio output signals 210 via a first audio output channel 220 to the first audio output jack 140 which, in turn, is intended for connection to an audio transducer, such as, for example, a speaker. The audio amplifier 130 further provides second audio output signals 224 via a second audio output channel 230 to the second audio output jack 150 which, in turn, is intended for connection to an audio transducer, such as, for example, headphones.

Each of the analog power lines 182, the analog signal inputs 186, the analog outputs 190, the audio amplifier circuitry 130, the first audio output signals 210, the first audio output channel 220, the first audio connector or jack 140, the second audio output signals 224, the audio output channel 230, the second audio output connector or jack 150, and the analog circuitry 122 of the audio circuitry controller 120 have AGP 154 as a common electrical ground reference. Thus, only analog signals and components, and no digital signals or components, are disposed or routed on or over the AGP 152.

The DGP 152 and the AGP 154 are physically and electrically separated along a first portion of their adjacent sections by a gap 174, which also separates the digital region 156 and the analog region 158 of the PCB 110. A connecting member 260 electrically connects together the DGP 152 and the AGP 154 to form a low-resistance electrical connection, or effective electrical short, between the DGP 152 and the AGP 154. The connecting member 260 is, in the exemplary embodiment shown, disposed within and bridges the gap 174.

The connecting member 260 thus forms a single-point electrical connection between the DGP 152 and the AGP 154. The connecting member 260 is an electrically conductive member having very low resistance, such as, for example, a strip or trace of copper or other conductive material. In one exemplary embodiment, the connecting member 260 is formed of copper or other conductive metallic material having a width of from approximately 50 to approximately 120 mils, although one skilled in the art will appreciate that the connecting member 260 can be alternately formed.

The single-point connection between the DGP 152 and the AGP 154 acts to keep the ground potentials of the two ground planes at substantially the same level, and reduces the transfer to the AGP 154 of digital noise that may be present on DGP 152 or its associated circuitry. Further, by routing and disposing, respectively, only analog signals and components, and no digital signals or components, on or over AGP 152, audio system 100 further substantially reduces the susceptibility of the audio components and signals to degradation and/or distortion due to the presence of undesirable non-audio signals. Thus, a substantial improvement in the fidelity of the reproduced audio signals is achieved by audio system 100.

Fidelity of the reproduced audio signal may also be degraded, as noted above, when the analog output channel carrying the audio signals are structured or configured in a manner that renders the audio output channel and, thus, the audio output signals carried thereby susceptible to interference from non-audio signals that are either induced in the audio output channel or are the result of a ground loop between the audio signal ground of the audio output channel and a non-audio ground as can exist when the audio signal ground is connected to a non-audio ground which, as described above, is done in the interest of enhancing ESD characteristics of the audio output channel. By structuring and configuring the audio output channel in a manner that substantially reduces the susceptibility thereof to interference from such non-audio signals and eliminating any ground loops between the audio signal ground and non-audio ground, a further improvement in the fidelity of reproduced audio signals is achieved by audio system 100.

Figure 2A:
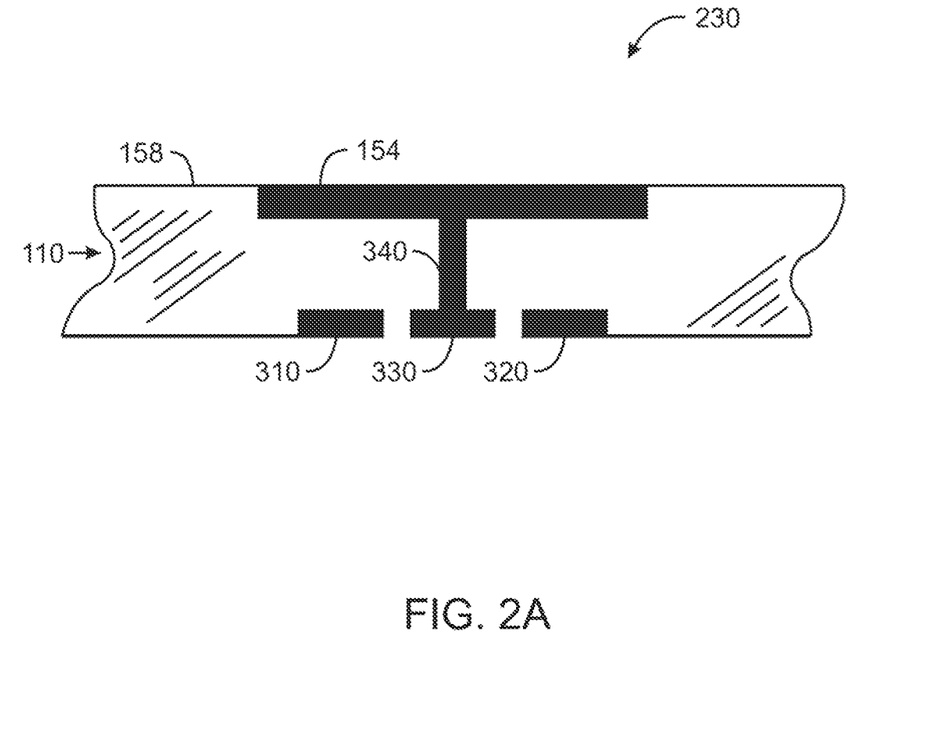
FIG. 2A is a cross-sectional end view of the audio output signal line of FIG. 1.

Referring now to FIG. 2A, the entirety of the analog output channel 230 is disposed within the analog portion 158 of the PCB 110. Generally, the analog output channel 230 extends in a substantially parallel manner relative to and opposite the AGP 154, and does not extend beyond or outside of the AGP 154. More particularly, the analog output channel 230 includes left and right channels 310 and 320, respectively, an audio ground return channel 330 and a stitching element 340. In an exemplary embodiment of the present invention, each of the left and right channels 310 and 320, respectively, and the audio ground return channel 330 are elongate members extending in a substantially parallel manner relative to and opposite AGP 154. The audio ground return channel 330 may be disposed between the left and right channels 310 and 320, respectively.

Disposing the audio ground return channel 330 between the left and right channels 310 and 320, respectively, shields the audio ground return channel from exposure to non-audio signals that may otherwise be induced into the ground return channel 330. Further, by disposing the AGP 154 between the analog output channel 230 and a source of electrical interference, the AGP 154 shields the analog output channel 230 from induced non-audio signals emanating from the source of electrical interference.

Figure 2B:
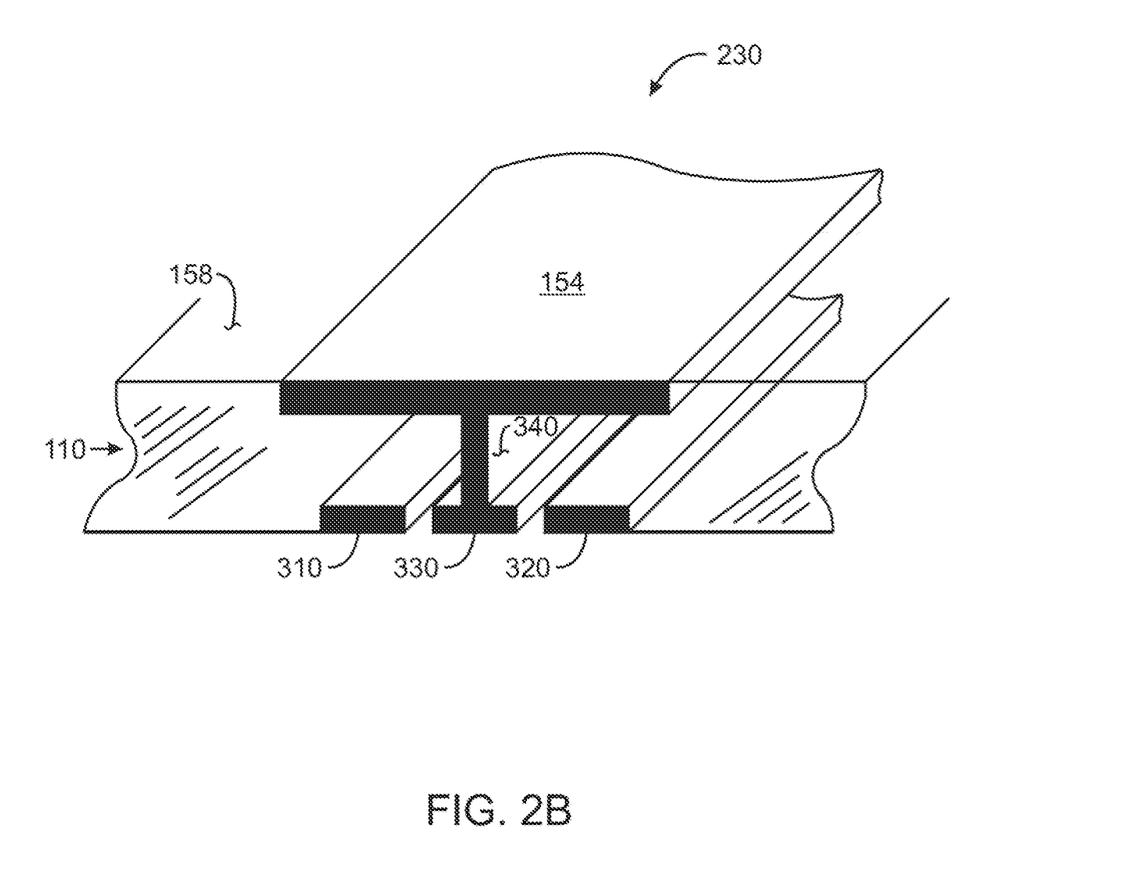
FIG. 2B is a cross-sectional side view of the audio output signal line of FIG. 2A.
Figure 2C:
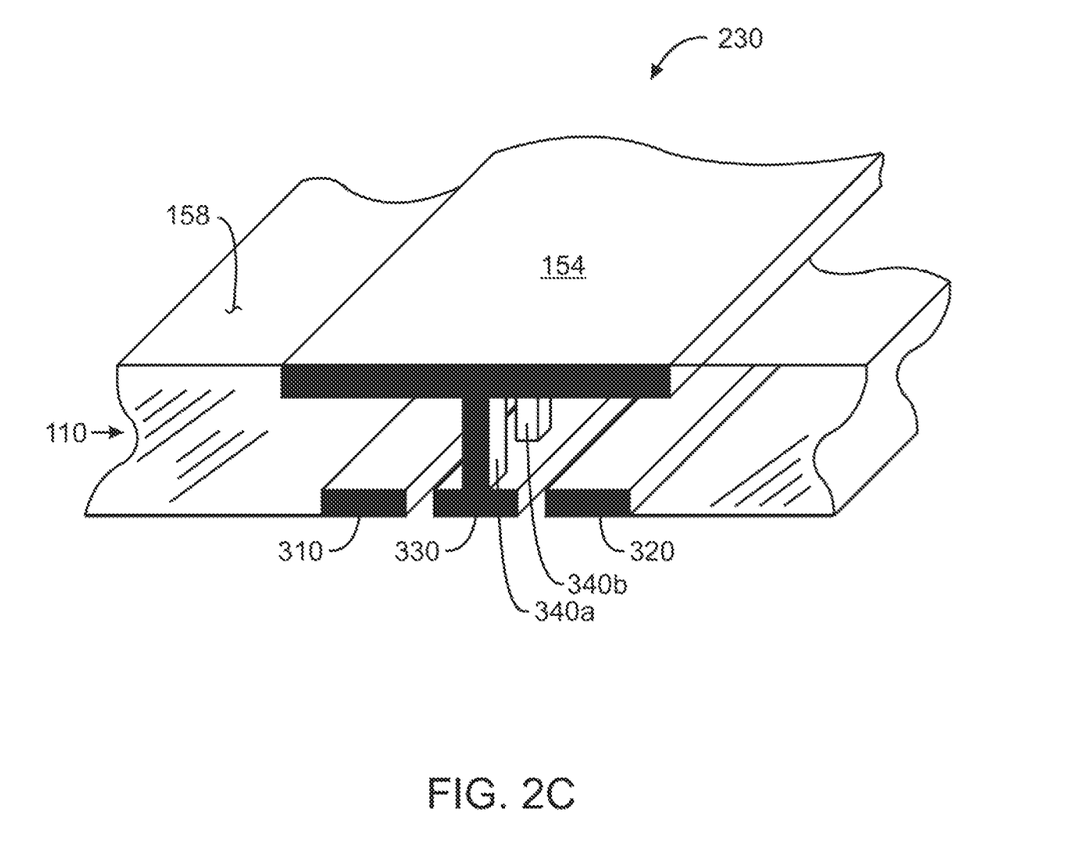
FIG. 2C is a cross-sectional side view of another audio output signal line according to an exemplary embodiment of the present invention.

The stitching element 340 electrically connects the audio ground return channel 330 and the AGP 154. As best shown in FIG. 2B, the stitching element 340 may comprise, in one exemplary embodiment, a continuous elongate element extending along and electrically connecting the entire length of the audio ground return channel 330 with a corresponding portion of AGP 154. As best shown in FIG. 2C, the stitching element 340 may be alternately configured as a plurality of spaced-apart stitching elements 340a, 340b, etc. (as shown in FIG. 2C), each of which electrically connect respective portions of the audio ground return channel 330 with corresponding portions of the AGP 154.

The left and right channels 310 and 320, respectively, and the AGP 154 are, in one exemplary embodiment hereof, each formed of conductive material, such as, for example, copper. Therefore, the AGP 154 shields the output channel 230 from electrical interference and the presence of unwanted and/or induced non-audio signals. Each of the left and right channels 310 and 320, respectively, and the ground return channel 330 are, in one exemplary embodiment hereof, also formed of a conductive material, such as, for example copper, having appropriate dimensions based on relevant operating parameters of the audio system 100, such as, for example, audio output current and/or power, as will be appreciated by one of ordinary skill in the art.

Figure 3:
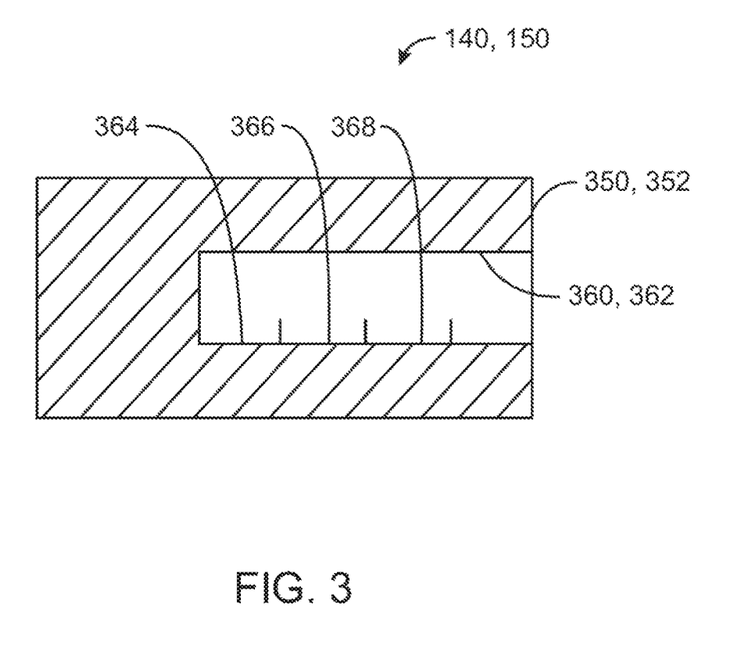
FIG. 3 is a cross-sectional view of the audio output connector of FIG. 1.

As shown in FIG. 3, the audio output jacks 140 and 150, unlike conventional audio jacks, include electrically nonconductive outer shells 350 and 352, respectively, and inner shells 360, 362, respectively. In one exemplary embodiment of the present invention, the outer shells 350, 352 are formed at least in part from an electrically nonconductive material, such as, for example, plastic. The electrically nonconductive characteristic of the outer shells 350, 352 deprives any electrostatic charges that may come into contact with the outer shells 350, 352 of a highly-conductive path from the outer shells 350, 352 to ground, thereby providing enhanced ESD characteristics and removing the need to provide a short and direct low-resistance path from the outer shells 350, 352 to electrical ground. Thus, the audio ground return channel 330 is electrically isolated from chassis, system and digital ground.

Unlike conventional electronic devices, there is no need to tie via an effective electrical short the non-conductive outer shell 350, 352 to a chassis, system or digital ground in order to improve ESD or other characteristics of the electronic device 100. With outer shell 350, 352 and, thus, the audio ground return channel 330 isolated from chassis, system and digital grounds, the presence of non-audio signals within the audio ground return channel 330 is substantially reduced and, thereby, a further improvement in the fidelity of reproduced audio signals is achieved by audio system 100.

Additionally, an exemplary embodiment of the present invention has the advantage of reducing the "noise floor" of the reproduced audio signal. More particularly, the noise floor of the reproduced audio output signal is reduced by the combined desirable effects of disposing the audio output channel 230 opposite the AGP 154, tying the audio ground return channel 330 to the separate AGP 154, and by disposing the audio ground return channel 330 between the left and right channels 310 and 320.

Figure 4:
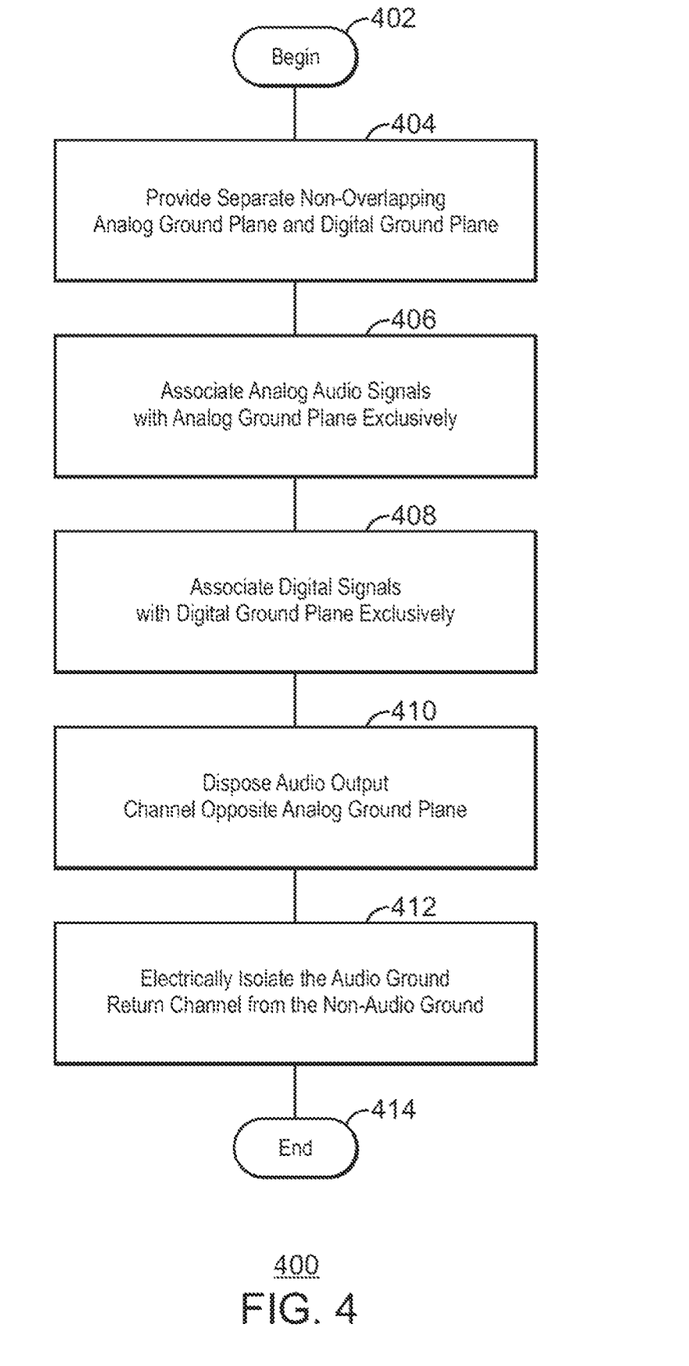
FIG. 4 is a block diagram showing a method for improving the fidelity of a reproduced audio signal according to an exemplary embodiment of the present invention.

Referring now to FIG. 4, a method for improving the fidelity of a reproduced audio signal according to an exemplary embodiment of the present invention is shown. The method is generally referred to by the reference number 400. At block 402, the method 400 begins.

The method 400 includes establishing separate and non-overlapping analog and digital ground channels, as shown at block 404. According to an exemplary embodiment of the present invention, the process of establishing separate and non-overlapping analog and digital ground references may be achieved by forming separate and mutually-exclusive, non-overlapping, analog and digital ground planes.

Analog audio signals and circuitry are exclusively associated with the analog ground plane, as shown at block 406. Associating analog and audio signals and analog circuitry exclusively with the analog ground plane may be achieved by disposing analog components and circuitry upon and/or over, and by routing analog signals on or over, the analog ground plane exclusively. Thus, only analog signals and components, and no digital signals or components, are disposed or routed on or over the analog ground plane.

At block 408, digital audio signals and circuitry are exclusively associated with the digital ground plane. Associating digital signals and digital circuitry exclusively with the digital ground plane may be achieved by disposing digital components and circuitry upon and/or over, and by routing digital signals on or over, the digital ground plane exclusively. Thus, only digital signals and components, and no analog signals or components, are disposed or routed on or over the digital ground plane.

An audio output channel is disposed opposite the analog ground plane at block 410. Disposing an audio output channel opposite the analog ground plane may be achieved by disposing the entire analog output channel opposite the analog ground plane. The audio output channel may be disposed in a substantially parallel manner relative to the analog ground plane.

Finally, the ground return channel of the audio output channel is electrically isolated from non-audio and non-analog ground, as shown at block 412. Electrically isolating from non-analog ground an audio ground return channel of the audio output channel may be achieved by disposing the ground return channel between the left and right channels of the audio output channel and, further, by electrically connecting the audio ground return channel to the analog ground. At block 414, the process ends.

What is claimed is:

1. An electronic device having an audio system for reproducing audio signals, the electronic device comprising:
   an analog region;
   a digital region that is separate and non-overlapping with respect to the analog region;
   an analog ground plane disposed within the analog region;
   a digital ground plane disposed within the digital region, wherein the digital ground plane and the analog ground plane are electrically connected by a single-point contact, the single point contract comprising a connecting member that connects the digital ground plane to the analog ground plane;
   digital circuitry associated with the digital ground plane, wherein digital signals are routed on or over the digital ground plane;
   analog circuitry associated with the analog ground plane, wherein analog signals are routed on or over the analog ground plane; and
   an audio output channel associated with and shielded by the analog ground plane, wherein the audio output channel comprises elongate members comprising a left channel, a right channel, and a ground return channel, the ground return channel disposed between the left channel and the right channel, and wherein the ground return channel is disposed along and opposite the analog ground plane and electrically connected to the analog ground plane.

2. The electronic device of claim 1, wherein the analog ground plane is a common electrical ground reference for the analog circuitry and the audio output channel, and wherein no digital components are disposed on or over the analog ground plane.

3. The electronic device of claim 1, wherein the audio output channel is disposed along the analog ground plane and does not extend beyond the analog ground plane, and wherein the analog ground plane shields the audio output channel from induced non-audio signals.

4. The electronic device of claim 1, wherein the elongate members of the audio output channel extend substantially parallel relative to the analog ground plane.

5. The electronic device of claim 1, comprising a stitching element electrically connecting the ground return channel with the analog ground plane, the stitching element comprising an elongate electrically-conductive member extending along and electrically connecting an entire length of the ground return channel of the audio output channel with a corresponding portion of the analog ground plane.

6. The electronic device of claim 1, comprising a stitching element electrically connecting the ground return channel with the analog ground plane, the stitching element comprising a plurality of separate and spaced-apart stitching elements, each of the separate and spaced-apart stitching elements electrically connecting the ground return channel with the analog ground plane.

7. The electronic device of claim 1, further comprising at least one audio output jack electrically connected to the audio output channel, a ground element of the at least one audio output jack being electrically connected to the analog ground plane via the audio output channel, the at least one audio output jack being electrically isolated from ground references other than the analog ground plane, and wherein the electronic device comprises only one analog ground plane.

8. The electronic device of claim 1, further comprising at least one audio output jack electrically connected to the audio output channel, the audio output jack having an outer shell, the outer shell being electrically nonconductive.

9. A method for improving fidelity of a reproduced audio signal, comprising:
   providing a first region of an electronic device, the first region comprising an analog ground plane;
   providing a second region of the electronic device, the second region comprising a digital ground plane, wherein the second region is separate and non-overlapping with respect to the first region;

associating analog audio circuitry with the analog ground plane;

associating digital circuitry with the digital ground plane;

connecting the digital ground plane directly to the analog ground plane via a single-point contact; and disposing an audio output channel along the analog ground, wherein the audio output channel comprises elongate members comprising a left channel, a right channel, and an audio round return channel the audio round return channel disposed along and opposite and electrically connected to the analog ground plane and further disposed between the left channel and the right channel to electrically isolate the audio ground return channel from non-analog ground.

10. The method of claims 9, comprising disposing the audio output channel such that the elongate members of the audio output channel extend substantially parallel relative to the analog ground plane, and wherein the audio ground return channel is not directly connected to the digital ground plane.

11. The method of claim 9, wherein the analog ground plane is a common electrical ground reference for the analog circuitry and the audio output channel, and wherein no digital components are disposed on or over the analog ground plane.

12. The method of claim 9, wherein the audio output channel does not extend the analog ground plane, and wherein the single-point contact comprises a connecting member having a width in a range of 50 thousandths of an inch (mils) to 120 mils.

13. The method of claim 9, wherein the audio ground return channel being electrically connected to the analog ground plane comprises connecting the audio ground return channel with the analog ground plane via a stitching element that comprises an elongate electrically-conductive member extending along and electrically connecting the audio ground return channel with the analog ground plane.

14. The electronic device of claim 1, wherein the single point contact comprises a connecting member bridging a gap between the analog ground plane and the digital ground plane, and wherein the ground return channel is disposed between the left channel and the right channel to reduce a noise floor of the electronic device.

15. The electronic device of claim 1, wherein the ground return channel being electrically connected via a stitching element to the analog ground plane, and wherein the single-point contact comprises a connecting member having a width in range of 50 thousandths of an inch (mils) to 120 mils.

16. The method of claim 9, wherein electrically connecting the audio ground return channel to the analog ground plane comprises electrically connecting, via a stitching element, the audio ground return channel to the analog ground plane.

17. The method of claim 9, wherein the single point contact comprises a connecting member bridging a gap between the analog ground plane and the digital ground plane, and wherein the analog audio circuitry is not associated with the digital ground plane, wherein analog audio signals will not run on or over the digital ground plane.

18. The method of claim 9, wherein the digital circuitry is not associated with the analog ground plane, wherein digital signals will not run on or over the analog ground plane, and wherein the electronic device comprises only one analog ground plane.

* * * * *

UNITED STATES PATENT AND TRADEMARK OFFICE
CERTIFICATE OF CORRECTION

PATENT NO. : 9,210,799 B2  
APPLICATION NO. : 13/259393  
DATED : December 8, 2015  
INVENTOR(S) : Gough et al.

Page 1 of 1

It is certified that error appears in the above-identified patent and that said Letters Patent is hereby corrected as shown below:

In the claims

Column 7, line 12, Claim 9, delete "round" and insert -- ground --, therefor.

Column 7, line 12, Claim 9, delete "channel" and insert -- channel, --, therefor.

Column 7, line 13, Claim 9, delete "round" and insert -- ground --, therefor.

Column 7, line 18, Claim 10, delete "claims" and insert -- claim --, therefor.

Signed and Sealed this  
Twenty-ninth Day of March, 2016

Michelle K. Lee  
*Director of the United States Patent and Trademark Office*